United States Patent
Chang et al.

(10) Patent No.: US 9,728,467 B2
(45) Date of Patent: Aug. 8, 2017

(54) METHOD FOR MODULATING WORK FUNCTION OF SEMICONDUCTOR DEVICE HAVING METAL GATE STRUCTURE BY GAS TREATMENT

(71) Applicant: United Microelectronics Corp., Hsinchu (TW)

(72) Inventors: Yun-Tzu Chang, Kaohsiung (TW); Shih-Min Chou, Tainan (TW); Kuo-Chih Lai, Tainan (TW); Ching-Yun Chang, Yunlin County (TW); Hsiang-Chieh Yen, Penghu County (TW); Yen-Chen Chen, Tainan (TW); Yang-Ju Lu, Changhua County (TW); Nien-Ting Ho, Tainan (TW); Chi-Mao Hsu, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/880,693

(22) Filed: Oct. 12, 2015

(65) Prior Publication Data

US 2017/0076995 A1  Mar. 16, 2017

(30) Foreign Application Priority Data

Sep. 15, 2015 (CN) .......................... 2015 1 0584677

(51) Int. Cl.
| | | |
|---|---|---|
| *H01L 21/302* | (2006.01) | |
| *H01L 29/788* | (2006.01) | |
| *H01L 21/28* | (2006.01) | |
| *H01L 21/8238* | (2006.01) | |

(52) U.S. Cl.
CPC .......................... *H01L 21/823842* (2013.01)

(58) Field of Classification Search
CPC ......... H01L 21/82345; H01L 29/42328; H01L 29/42332; H01L 21/823842; H01L 29/42344
See application file for complete search history.

(56) References Cited

U.S. PATENT DOCUMENTS

| | | | |
|---|---|---|---|
| 6,373,111 B1 | 4/2002 | Zheng et al. | |
| 7,732,344 B1 * | 6/2010 | Tsai ................ | H01L 21/823842 257/E21.023 |
| 8,669,615 B1 | 3/2014 | Chang et al. | |
| 2012/0256276 A1 | 10/2012 | Hwang et al. | |

(Continued)

*Primary Examiner* — Benjamin Sandvik
*Assistant Examiner* — Damon Hillman
(74) *Attorney, Agent, or Firm* — J.C. Patents

(57) ABSTRACT

A method for modulating a work function of a semiconductor device having a metal gate structure including the following steps is provided. A first stacked gate structure and a second stacked gate structure having an identical structure are provided on a substrate. The first stacked gate structure and the second stacked gate structure respectively include a first work function metal layer of a first type. A patterned hard mask layer is formed. The patterned hard mask layer exposes the first work function metal layer of the first stacked gate structure and covers the first work function metal layer of the second stacked gate structure. A first gas treatment is performed to the first work function metal layer of the first stacked gate structure exposed by the patterned hard mask layer. A gas used in the first gas treatment includes nitrogen-containing gas or oxygen-containing gas.

18 Claims, 3 Drawing Sheets

(56) References Cited

U.S. PATENT DOCUMENTS

| | | |
|---|---|---|
| 2013/0087856 A1 | 4/2013 | Ortolland et al. |
| 2013/0105879 A1* | 5/2013 | Breil ................. H01L 29/42376 257/316 |
| 2014/0124875 A1 | 5/2014 | Chung et al. |
| 2015/0069533 A1 | 3/2015 | Lin et al. |

* cited by examiner

METHOD FOR MODULATING WORK FUNCTION OF SEMICONDUCTOR DEVICE HAVING METAL GATE STRUCTURE BY GAS TREATMENT

CROSS-REFERENCE TO RELATED APPLICATION

This application claims the priority benefit of China patent application serial no. 201510584677.9, filed on Sep. 15, 2015. The entirety of the above-mentioned patent application is hereby incorporated by reference herein and made a part of the specification.

BACKGROUND OF THE INVENTION

Field of the Invention

The invention is related to method for fabricating a semiconductor device, and particularly related to a method for modulating work function of a semiconductor device having a metal gate structure.

Description of Related Art

As the size of a semiconductor device is getting smaller, the size of a gate structure and the thickness of a gate dielectric layer have been reduced. However, leakage current occurs under the condition where the thickness of the gate dielectric layer formed of silicon oxide is reduced. To avoid occurrence of leakage current, the conventional means adopts high dielectric constant (high-k) material to replace silicon oxide to form the gate dielectric layer. Under the condition where high dielectric constant material is used for making the gate dielectric layer, the gate formed of polysilicon reacts with the high dielectric constant material, and Fermi-level pinning is generated consequently. Thus, threshold voltage increases, and the performance of the device is affected accordingly. Therefore, in most cases, a metal gate is used to replace the polysilicon gate.

Currently, it is a common means to adjust the threshold voltage of the semiconductor device by modulating the thickness of work function metal layer or via ion implant tuning. Since it costs more to use ion implant tuning for adjustment, it is more common to adjust the threshold voltage of the semiconductor device by modulating the thickness of work function metal layer.

However, under the condition where the work function of the semiconductor device is modulated through the means of adjusting the thickness of the work function metal layer, if the thickness of the work function metal layer is thin, it is difficult to control process stability and form a continuous film.

SUMMARY OF THE INVENTION

The invention provides a method for modulating a work function of a semiconductor device having a metal gate structure, which enables the work function of the semiconductor device to be modulated via a simple process.

The invention provides a method for modulating a work function of a semiconductor device having a metal gate structure, which includes the following steps. A first stacked gate structure and a second stacked gate structure having an identical structure are provided on a substrate. The first stacked gate structure and the second stacked gate structure respectively include a first work function metal layer of a first type. A patterned hard mask layer is formed. The patterned hard mask layer exposes the first work function metal layer of the first stacked gate structure and covers the first work function metal layer of the second stacked gate structure. A first gas treatment is performed to the first work function metal layer of the first stacked gate structure exposed by the patterned hard mask layer. A gas used in the first gas treatment includes nitrogen-containing gas or oxygen-containing gas.

According to an embodiment of the invention, in the method for modulating the work function of the semiconductor device having the metal gate structure, a method for forming the first work function metal layer is, for example, atomic layer deposition (ALD).

According to an embodiment of the invention, in the method for modulating the work function of the semiconductor device having the metal gate structure, the first stacked gate structure and the second stacked gate structure respectively further include a gate dielectric layer. The gate dielectric layer is disposed between the first work function metal layer and the substrate respectively.

According to an embodiment of the invention, in the method for modulating the work function of the semiconductor device having the metal gate structure, a method for forming the gate dielectric layer is, for example, ALD.

According to an embodiment of the invention, in the method for modulating the work function of the semiconductor device having the metal gate structure, the first stacked gate structure and the second stacked gate structure respectively further include an interfacial layer. The interfacial layer is disposed between the gate dielectric layer and the substrate respectively.

According to an embodiment of the invention, in the method for modulating the work function of the semiconductor device having the metal gate structure, a method for forming the interfacial layer is, for example, a thermal oxidization process or chemical vapor deposition (CVD).

According to an embodiment of the invention, in the method for modulating the work function of the semiconductor device having the metal gate structure, the first stacked gate structure and the second stacked gate structure respectively further include a barrier layer. The barrier layer is disposed between the first work function metal layer and the gate dielectric layer respectively.

According to an embodiment of the invention, in the method for modulating the work function of the semiconductor device having the metal gate structure, the barrier layer can be a single-layer structure or a multiple-layer structure.

According to an embodiment of the invention, in the method for modulating the work function of the semiconductor device having the metal gate structure, a method for forming the barrier layer is, for example, ALD.

According to an embodiment of the invention, in the method for modulating the work function of the semiconductor device having the metal gate structure, a third stacked gate structure can be further provided on the substrate. The third stacked gate structure has a second work function metal layer of the first type; the second work function metal layer and the first work function metal layer can have different thicknesses.

According to an embodiment of the invention, in the method for modulating the work function of the semiconductor device having the metal gate structure, a fourth stacked gate structure can be further provided on the substrate. The fourth stacked gate structure and the third stacked gate structure have an identical structure. The patterned hard mask layer exposes the second work function metal layer of the third stacked gate structure and covers the second work function metal layer of the fourth stacked gate structure.

According to an embodiment of the invention, in the method for modulating the work function of the semiconductor device having the metal gate structure, a first gas treatment can be further performed to the second work function metal layer of the third stacked gate structure exposed by the patterned hard mask layer.

According to an embodiment of the invention, in the method for modulating the work function of the semiconductor device having the metal gate structure, a fifth stacked gate structure can be further provided on the substrate. The fifth stacked gate structure and the first stacked gate structure are different in that the fifth stacked gate structure does not have the first work function metal layer.

According to an embodiment of the invention, in the method for modulating the work function of the semiconductor device having the metal gate structure, after the patterned hard mask layer is removed, a third work function metal layer of a second type of the fifth stacked gate structure can be further formed.

According to an embodiment of the invention, in the method for modulating the work function of the semiconductor device having the metal gate structure, the nitrogen-containing gas is, for example, $N_2$ or $NH_3$.

According to an embodiment of the invention, in the method for modulating the work function of the semiconductor device having the metal gate structure, the oxygen-containing gas is, for example, $O_2$ or $O_3$.

According to an embodiment of the invention, in the method for modulating the work function of the semiconductor device having the metal gate structure, the patterned hard mask layer can be further removed after the first gas treatment is performed.

According to an embodiment of the invention, the method for modulating the work function of the semiconductor device having the metal gate structure further includes the following steps. A fourth work function metal layer of the second type is formed on the first work function metal layer of the first stacked gate structure. A fifth work function metal layer of the second type is formed on the first work function metal layer of the second stacked gate structure.

According to an embodiment of the invention, in the method for modulating the work function of the semiconductor device having the metal gate structure, a second gas treatment can be further performed to one of the fourth work function metal layer and the fifth work function metal layer. The gas used in the second gas treatment includes nitrogen-containing gas or oxygen-containing gas.

According to an embodiment of the invention, in the method for modulating the work function of the semiconductor device having the metal gate structure, the fourth work function metal layer and the fifth work function metal layer can have an identical thickness or different thicknesses.

Based on the above, in the method for modulating the work function of the semiconductor device having the metal gate structure, since the first work function metal layer of the first stacked gate structure exposed by the patterned hard mask layer is exposed to the gas environment when the first gas treatment is performed, the work function of the semiconductor device having the first stacked gate structure can be changed. Accordingly, the simple process makes it possible for the semiconductor device having the first stacked gate structure and the semiconductor device having the second stacked gate structure to have different threshold voltages.

In addition, comparing with the method of modulating the work function of the semiconductor device via ion implant tuning, the above method of modulating the work function of the semiconductor device can reduce the ion implanting process. Therefore, the manufacturing cost can be reduced. Moreover, comparing with the method of modulating the work function of the semiconductor device by simply adjusting the thickness of the work function metal layer, the above method of modulating work function of the semiconductor device makes it easier to control process stability, and the first work function metal layer with higher reliability can be formed.

In order to make the aforementioned features and advantages of the disclosure more comprehensible, embodiments accompanying figures are described in detail below.

DESCRIPTION OF EMBODIMENTS

Figure 1A:
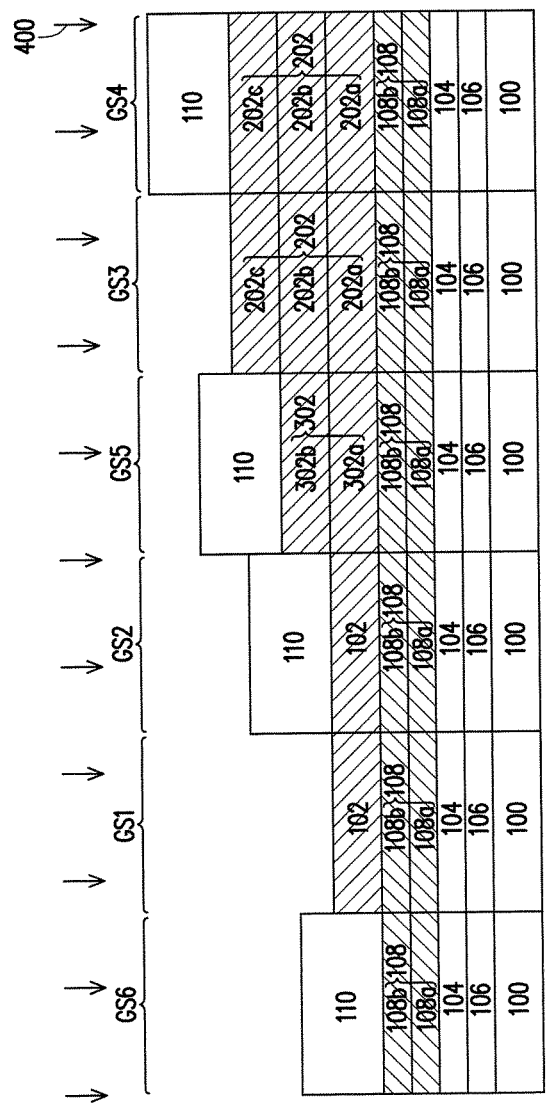
FIGS. 1A to 1B are sectional schematic views illustrating modulation of a work function of a semiconductor device having a metal gate structure according to an embodiment of the invention.

Referring to the drawings attached, the disclosure will be described by means of the embodiments below. Nevertheless, the disclosure can be embodied in many different forms and should not be construed as limited to the embodiments set forth herein. The language used to describe the directions such as "above", "below", "front", "back", "inner", and "external" or the like in the reference drawings should be regarded in an illustrative rather than in a restrictive sense. Thus, the language used to describe the directions is not intended to limit the scope of the disclosure. For the purpose of clarity, the sizes and relative sizes of each of the layers in the drawings can be illustrated in exaggerated proportions.

Figure 1B:
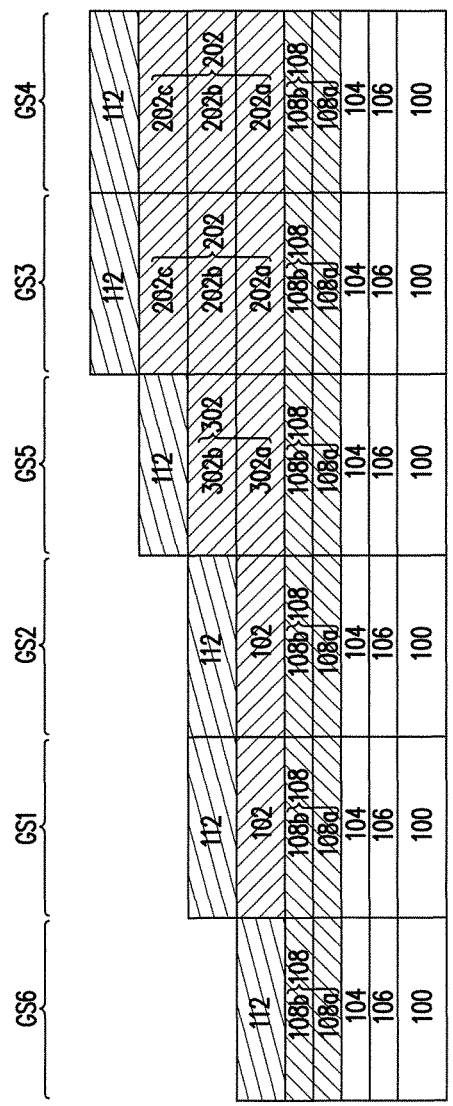
Figure 2:
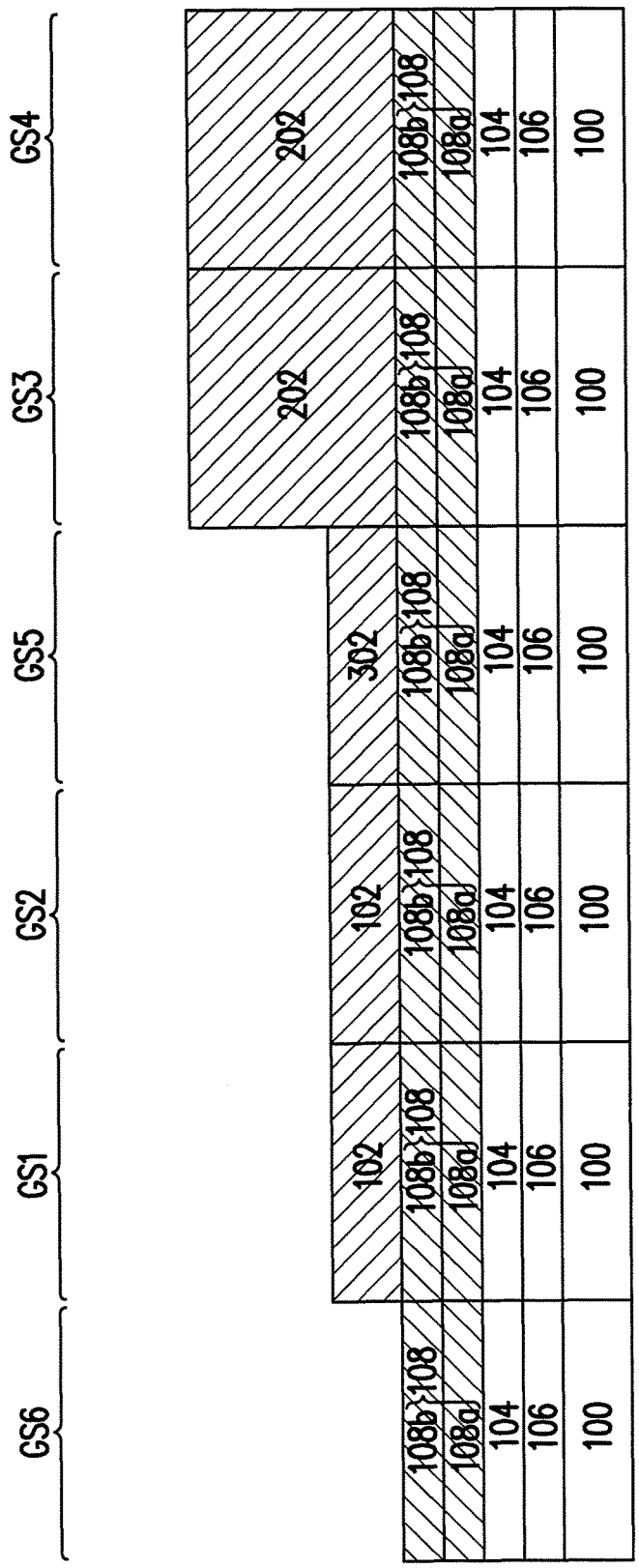
FIG. 2 is a sectional schematic view illustrating a metal gate structure according to another embodiment of the invention.

FIGS. 1A to 1B are sectional schematic views illustrating modulation of a work function of a semiconductor device having a metal gate structure according to an embodiment of the invention. FIG. 2 is a sectional schematic view illustrating a metal gate structure according to another embodiment of the invention.

In FIG. 1A through FIG. 1B and FIG. 2, for simplification of the drawings, stacked gate structures GS1 to GS6 are illustrated side by side, and it should be comprehensible by persons having ordinary skill in the art that the stacked gate structures GS1 to GS6 are separately disposed on the same substrate 100, and the work function metal layers in different stacked gate structures GS1 to GS6 are not connected to one another.

Referring to FIG. 1A, a stacked gate structure GS1 and a stacked gate structure GS2 having an identical structure are provided on a substrate 100. In addition, it is optional to further provide at least one of the stacked gate structures GS3 to GS6 on the substrate 100. The stacked gate structures GS1 to GS6 can respectively serve as a metal gate structure for the semiconductor device. The semiconductor device is, for example, a transistor device such as a fin field effect transistor (Fin-FET). In the embodiment, the stacked gate structures GS1, GS2, and GS6 are respectively exemplified as a metal gate structure of an N-type metal oxide semiconductor (NMOS) transistor, and the stacked gate structures GS3, GS4 and GS5 are respectively exemplified as a metal gate structure of a P-type metal oxide semiconductor (PMOS).

The stacked gate structure GS1 and stacked gate structure GS2 respectively include a work function metal layer 102 of a first type. The stacked gate structure GS3 and the stacked gate structure GS4 can have an identical structure and respectively have a work function metal layer 202 of the first type. The stacked gate structure GS5 has a work function metal layer 302 of the first type. The stacked gate structure GS6 and the stacked gate structure GS1 are different in that the stacked gate structure GS6 does not have the work function metal layer 102.

The work function metal layers 102, 202 and 302 of the first type can be a P-type work function metal layer or N-type work function metal layer. The material of the P-type work function metal layer is, for example, TiN, TiSiN or TaN. The material of the N-type work function metal layer is for example, TiAl, TiAlN, TaC, TaAlN or TiC. In the embodiment, the work function metal layers 102, 202, 302 of the first type are exemplified as a P-type work function metal layer formed of TiN. The method for forming the work function metal layers 102, 202 and 302 is, for example, atomic layer deposition (ALD).

In addition, the work function metal layers 102, 202 and 302 can have different thicknesses, such that the semiconductor device having the work function metal layers 102, 202 and 302 has different work functions. For example, the thickness of the work function metal layer 202 can be greater than the thickness of the work function metal layer 302, and the thickness of the work function metal layer 302 can be greater than the thickness of the work function metal layer 102, which should not be construed as a limitation to the invention. In terms of the PMOS transistor, if the thickness of the P-type work function metal layer is thicker, the threshold voltage is less; if the thickness of the N-type work function metal layer is thicker, the threshold voltage is greater. In terms of the NMOS transistor, if the thickness of the N-type work function metal layer is thicker, the threshold voltage is less; if the thickness of the P-type work function metal layer is thicker, the threshold voltage is greater.

Moreover, the thickness of the work function metal layers 102, 202 and 302 can be adjusted via the number of layers of the work function metal layer (as shown by FIG. 1A) or the thickness of a single-layer of the work function metal layer (as shown by FIG. 2). Referring to FIG. 1A, the work function metal layer 102 is a single-layer structure. The work function metal layer 202 is a three-layer structure including work function metal layers 202a, 202b, 202c, and the work function metal layer 302 is a two-layer structure including work function metal layers 302a and 302b, such that the thickness of the work function metal layer 202 is greater than the thickness of work function metal layer 302, and the thickness of the work function metal layer 302 is greater than the thickness of the work function metal layer 102. Referring to FIG. 2, with the design of the process, the thickness of the single-layer work function metal layer 202 can be modulated to be greater than the thickness of the single-layer work function metal layer 302, and the thickness of the single-layer work function metal layer 302 can be modulated to be greater than the thickness of the work function metal layer 102. Moreover, the same elements in FIG. 2 and FIG. 1A are denoted by the same reference numerals; please refer to the descriptions concerning FIG. 1A.

Further referring to FIG. 1A, the stacked gate structures GS1 to GS6 respectively further include at least one of a gate dielectric layer 104, an interfacial layer 106 and a barrier layer 108. In the stacked gate structures GS1 to GS5, the gate dielectric layers 104 are disposed between the work function metal layers 102, 202, 302 and the substrate 100 respectively. In the stacked gate structure GS6, the gate dielectric layer 104 is disposed on the substrate 100. The material of the gate dielectric layer 104 is, for example, high dielectric constant material such as $HfO_2$, $ZrO_2$, $Al_2O_3$, AlN, $TiO_2$, $La_2O_3$, $Y_2O_3$, $Gd_2O_3$, $Ta_2O_5$ or a combination thereof. A method for forming the gate dielectric layer 104 is, for example, ALD.

The interfacial layers 106 are disposed between the gate dielectric layers 104 and the substrate 100 respectively. The interfacial layer 106 can increase the adhesion between the gate dielectric layer 104 and the substrate 100 and prevent occurrence of leakage current. The material of the interfacial layer 106 is, for example, silicon oxide. A method for forming the interfacial 106 is, for example, a thermal oxidization process or chemical vapor deposition (CVD).

In the stacked gate structures GS1 to GS5, the barrier layers 108 are disposed between the work function metal layers 102, 202, 302 and the gate dielectric layers 104 respectively. The barrier layer 108 can serve as an etching stopping layer. In the stacked gate structure GS6, the barrier layer 108 is disposed on the gate dielectric layer 104. The barrier layer 108 can be a single-layer structure or a multiple-layer structure. In the embodiment, the barrier layer 108 is exemplified as a double-layer structure including a barrier layer 108a and a barrier layer 108b, which should not be construed as a limitation to the invention. The material of the barrier layer 108a is, for example, TiN. The material of the barrier layer 108b is, for example, TaN. A method for forming the barrier layer 108a and the barrier layer 108b is, for example, ALD.

A patterned hard mask layer 110 is formed. The patterned hard mask layer 110 exposes the work function metal layer 102 of the stacked gate structure GS1 and covers the work function metal layer 102 of the stacked gate structure GS2. The patterned hard mask layer 110 can further expose the work function metal layer 202 of the stacked gate structure GS3 and covers the work function metal layer 202 of the stacked gate structure GS4. In addition, it is optional that the patterned hard mask layer 110 can further cover the work function metal layer 302 of the stacked gate structure GS5 and the barrier layer 108 of the stacked gate structure GS6. The material of the patterned hard mask layer 110 is, for example, silicon nitride. The patterned hard mask layer 110 is formed by, for example, performing CVD to form a hard mask layer (not shown), and performing a patterning process to the hard mask layer.

A gas treatment 400 is performed to the work function metal layer 102 of the stacked gate structure GS1 exposed by the patterned hard mask layer 110. The gas used in the gas treatment 400 includes nitrogen-containing gas or oxygen-containing gas. The nitrogen-containing gas is, for example, $N_2$ or $NH_3$. The oxygen-containing gas is, for example, $O_2$ or $O_3$. The temperature of the gas treatment 400 is, for example, about 300° C. to 1000° C. The time required for performing the gas treatment 400 is, for example, about 5 seconds to 2 minutes.

When performing the gas treatment 400, since the work function metal layer 102 of the stacked gate structure GS1 exposed by the patterned hard mask layer 110 is exposed to the gas environment, the work function of the semiconductor device having the stacked gate structure GS1 can be changed. In other words, even if the stacked gate structure GS1 and the stacked gate structure GS2 have the identical structure, the above simple gas treatment process 400 still makes it possible for the semiconductor device having the stacked gate structure GS1 and the semiconductor device having the stacked gate structure GS2 to have different threshold voltages.

Moreover, when performing the gas treatment 400, the gas treatment 400 can be further performed to the work function metal layer 202 of the stacked gate structure GS3 exposed by the patterned hard mask layer 110. The simple process makes it possible for the semiconductor device having the stacked gate structure GS3 and the semiconductor device having the stacked gate structure GS4 to have different threshold voltages.

In the embodiment, the stacked gate structure GS1 is exemplified as being used in the NMOS transistor, and the stacked gate structure GS3 is exemplified as being used in the PMOS transistor. After being treated by the same gas treatment 400, the threshold voltage of the NMOS transistor and the threshold voltage of the PMOS transistor change in the same way, for example, to become greater or less at the same time.

Referring to FIG. 1B, after the gas treatment 400 is performed, the patterned hard mask layer 110 is removed. A method for removing the patterned hard mask layer 110 is, for example, dry etching or wet etching.

After the patterned hard mask layer 110 is removed, a work function metal layer 112 of a second type can be formed on the barrier layer 108 of the stacked gate structure GS6. Meanwhile, the work function metal layers 112 of the second type can be formed on the work function metal layers 102, 202 and 302 of the stacked gate structures GS1 to GS5 respectively. The work function metal layer 112 of the second type can be an N-type work function metal layer or P-type work function metal layer. The material of the N-type work function metal layer is, for example, TiAl, TiAlN, TaC, TaAlN or TiC. The material of the P-type work function metal layer is, for example, TiN, TiSiN or TaN. In the embodiment, the work function metal layer 112 of the second type is exemplified as the N-type work function metal layer formed of TiAl. A method for forming the work function metal layer 112 is, for example, ALD.

The work function metal layers 112 in the stacked gate structures GS1 to GS6 can have an identical thickness or different thicknesses. Moreover, by adjusting the thickness of the work function metal layers 112, it is possible to further modulate the threshold voltage of the semiconductor device having the stacked gate structures GS1 to GS6.

In addition, it is optional that the gas treatment can be further performed to one or more work function metal layers 112 in the stacked gate structures GS1 to GS6 so as to further modulate the threshold voltage of the selected semiconductor device. That is, the patterned hard mask layer (not shown) can serve as the mask, and the gas treatment can be performed to one or more work function metal layers 112 in the stacked gate structures GS1 to GS6 exposed by the patterned hard mask layer. Please refer to the method of performing the gas treatment 400 illustrated in FIG. 1A for the details concerning the gas treatment performed to the work function metal layer 112. However, persons having ordinary skill in the art can adjust the parameters of the gas treatment based on the design of the process, or select the stacked gate structure to be used for the gas treatment.

For example, in terms of the stacked gate structure GS1 and the stacked gate structure GS2 that have the identical structure, the patterned hard mask layer can expose the work function metal layer 112 in one of the stacked gate structure GS1 and stacked gate structure GS2, and the gas treatment can be performed to the exposed work function metal layer 112 so as to further adjust the threshold voltage difference between the semiconductor device having the stacked gate structure GS1 and the semiconductor device having the stacked gate structure GS2. The gas used in the gas treatment performed to the work function metal layer 112 includes nitride-containing gas or oxygen-containing gas. The nitride-containing gas is, for example, $N_2$ or $NH_3$. The oxygen-containing gas is, for example, $O_2$ or $O_3$.

Thereafter, the rest of processes for fabricating the metal gate structure can be continued. The subsequent processes for fabricating the metal gate structure are already known to persons having ordinary skill in the art; therefore, no further descriptions are incorporated herein.

Based on the above embodiments, in the method for modulating the work function of the semiconductor device, four types of different stacked gate structures can be adopted to fabricate six types of semiconductor devices having different threshold voltages, which should not be construed as a limitation to the invention. It is regarded as within the scope sought to be protected by the invention as long as the following condition is met, namely, in a plurality of stacked gate structures that have the identical structure, the patterned hard mask layer serves as the mask, and the gas treatment is performed to the work function metal layer exposed by the patterned hard mask layer.

In summary, with the method for modulating the work function of the semiconductor device having the metal gate structure provided in the above embodiments, the semiconductor devices having the same stacked gate structure can have different threshold voltages via a simple process. In addition, comparing with the method for modulating the work function of the semiconductor device via ion implant tuning, the method for modulating the work function of the semiconductor device provided in the above embodiments can help to save manufacturing cost. Moreover, comparing with the method for modulating the work function of semiconductor device by simply adjusting the thickness of the work function metal layer, the method for modulating the work function of the semiconductor device provided in the above embodiments makes it easier to control process stability, and the work function metal layer with higher reliability can be formed.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:
1. A method for modulating a work function of a semiconductor device having a metal gate structure, comprising:
providing a first stacked gate structure and a second stacked gate structure having an identical structure on a substrate, wherein the first stacked gate structure and the second stacked gate structure respectively comprise a first work function metal layer of a first type;
forming a patterned hard mask layer, wherein the patterned hard mask layer exposes the first work function metal layer of the first stacked gate structure and covers the first work function metal layer of the second stacked gate structure;
performing a first gas treatment to the first work function metal layer of the first stacked gate structure exposed by the patterned hard mask layer, wherein a gas used in the first gas treatment comprises nitrogen-containing gas or oxygen-containing gas;

providing a third stacked gate structure on the substrate, wherein the third stacked gate structure comprises a second work function metal layer of the first type, and the second work function metal layer and the first work function metal layer have different thicknesses; and providing a fourth stacked gate structure on the substrate, wherein the fourth stacked gate structure and the third stacked gate structure have an identical structure, and the patterned hard mask layer exposes the second work function metal layer of the third stacked gate structure and covers the second work function metal layer of the fourth stacked gate structure.

2. The method for modulating the work function of the semiconductor device having the metal gate structure according to claim 1, wherein a method for forming the first work function metal layer comprises atomic layer deposition (ALD).

3. The method for modulating the work function of the semiconductor device having the metal gate structure according to claim 1, wherein the first stacked gate structure and the second stacked gate structure respectively further comprise a gate dielectric layer disposed between the first work function metal layer and the substrate respectively.

4. The method for modulating the work function of the semiconductor device having the metal gate structure according to claim 3, wherein a method for forming the gate dielectric layer comprises ALD.

5. The method for modulating the work function of the semiconductor device having the metal gate structure according to claim 3, wherein the first stacked gate structure and the second stacked gate structure respectively further comprise an interfacial layer disposed between the gate dielectric layer and the substrate respectively.

6. The method for modulating the work function of the semiconductor device having the metal gate structure according to claim 5, wherein a method for forming the interfacial layer comprises a thermal oxidization process or chemical vapor deposition (CVD).

7. The method for modulating the work function of the semiconductor device having the metal gate structure according to claim 3, wherein the first stacked gate structure and the second stacked gate structure respectively further comprise a barrier layer disposed between the first work function metal layer and the gate dielectric layer respectively.

8. The method for modulating the work function of the semiconductor device having the metal gate structure according to claim 7, wherein the barrier layer comprises a single-layer structure or a multiple-layer structure.

9. The method for modulating the work function of the semiconductor device having the metal gate structure according to claim 7, wherein a method for forming the barrier layer comprises ALD.

10. The method for modulating the work function of the semiconductor device having the metal gate structure according to claim 1, further comprising performing the first gas treatment to the second work function metal layer of the third stacked gate structure exposed by the patterned hard mask layer.

11. The method for modulating the work function of the semiconductor device having the metal gate structure according to claim 1, further comprising providing a fifth stacked gate structure on the substrate, wherein the fifth stacked gate structure and the first stacked gate structure are different in that the fifth stacked gate structure does not have the first work function metal layer.

12. The method for modulating the work function of the semiconductor device having the metal gate structure according to claim 11, after removing the patterned hard mask layer, further comprising forming a third work function metal layer of a second type of the fifth stacked gate structure.

13. The method for modulating the work function of the semiconductor device having the metal gate structure according to claim 1, wherein the nitrogen-containing gas comprises $N_2$ or $NH_3$.

14. The method for modulating the work function of the semiconductor device having the metal gate structure according to claim 1, wherein the oxygen-containing gas comprises $O_2$ or $O_3$.

15. The method for modulating the work function of the semiconductor device having the metal gate structure according to claim 1, further comprising removing the patterned hard mask layer after performing the first gas treatment.

16. The method for modulating the work function of the semiconductor device having the metal gate structure according to claim 1, further comprising:
    forming a fourth work function metal layer of a second type on the first work function metal layer of the first stacked gate structure; and
    forming a fifth work function metal layer of the second type on the first work function metal layer of the second stacked gate structure.

17. The method for modulating the work function of the semiconductor device having the metal gate structure according to claim 16, further comprising performing a second gas treatment to one of the fourth work function metal layer and the fifth work function metal layer, wherein a gas used in the second gas treatment comprises nitrogen-containing gas or oxygen-containing gas.

18. The method for modulating the work function of the semiconductor device having the metal gate structure according to claim 16, wherein the fourth work function metal layer and the fifth work function metal layer have an identical thickness or different thicknesses.

* * * * *